United States Patent [19]
Lu et al.

[11] Patent Number: 6,030,872
[45] Date of Patent: Feb. 29, 2000

[54] METHOD OF FABRICATING MIXED-MODE DEVICE

[75] Inventors: Jau-Hone Lu; Shu-Ying Lu, both of Hsinchu Hsien; Chang-Ming Lu, Taoyuan Hsien; Ya-Ling Hung, Taichung, all of Taiwan

[73] Assignee: United Integrated Circuits Corp., Hsinchu, Taiwan

[21] Appl. No.: 09/241,545

[22] Filed: Feb. 1, 1999

[30] Foreign Application Priority Data

Dec. 3, 1998 [TW] Taiwan ................................. 87120058

[51] Int. Cl.$^7$ .................................................. H01L 21/336
[52] U.S. Cl. .......................... 438/283; 438/241; 438/279; 438/981
[58] Field of Search ..................... 438/283, 588, 438/263, 264, 594, 981, 201, 241, 258, 266, 275, 277, 279, 431, 437

[56] References Cited

U.S. PATENT DOCUMENTS

| | | | |
|---|---|---|---|
| 4,397,077 | 8/1983 | Derbenwick et al. | 438/981 |
| 5,028,554 | 7/1991 | Kita | 438/305 |

*Primary Examiner*—Chandra Chaudhari
*Assistant Examiner*—Jack Chen
*Attorney, Agent, or Firm*—Jiawei Huang; J.C. Patents

[57] ABSTRACT

A method for fabricating a mixed-mode device. A first gate oxide layer and a second gate oxide layer are formed. The polysilicon layer is used as a mask to pattern the gate oxide layers. Additionally, a top electrode is formed during the first gate oxide layer is patterned. A bottom electrode is formed during the second gate oxide layer is patterned. The first gate oxide layer and the second gate oxide layer are formed by a single oxidation operation, thus thicknesses of the first gate oxide layer and the second oxide layer can be effectively controlled.

10 Claims, 4 Drawing Sheets

METHOD OF FABRICATING MIXED-MODE DEVICE

CROSS-REFERENCE TO RELATED APPLICATION

This application claims the priority benefit of Taiwan application serial no. 87120058, filed Dec. 3, 1998, the full disclosure of which is incorporated herein by reference.

BACKGROUND OF THE INVENTION

1. Field of the Invention

The present invention relates to a semiconductor fabricating method. More particularly, the present invention relates to a method of fabricating, a mixed-mode device.

2. Description of the Related Art

A mixed-mode device is frequently utilized in an embedded dynamic random access memory (DRAM) or an embedded static random access memory (SRAM). In a mixed mode device, different gates are supplied with different operation voltages. For example when the gate lengths are 0.25 micro-meter 0.3 micro-meter, and 0.5 micro-meter, the current and operation voltages for the gate are 50 A/2.5 V. 70 A/3.3 V, and 130 A/5 V, respectively.

A dual-gate oxide layer is required in a mixed-mode device. A dual-gate oxide layer includes a thick gate oxide layer and a thin gate oxide layer. The thick gate oxide layer is formed by double oxidation steps and the thin gate oxide layer is formed by single oxidation step. The thick gate oxide layer and the thin gate oxide layer are formed on different side of an isolation structure. Then, some follow-up steps are performed to complete a mixed-mode device.

FIGS. 1A through 1D are schematic, cross-sectional views showing a fabricating process for a conventional mixed-mode device.

In FIG. 1A, an isolation structure 102 is formed in a substrate 100. A doped polysilicon layer (not shown) is formed over the substrate 100. The doped polysilicon layer is patterned to form a bottom electrode 104 of a capacitor (shown in FIG. 1D) on the isolation structure 102.

In FIG. 1B, a gate oxide layer (not shown) is formed by thermal oxidation. The thickness of the gate oxide layer is about 95 angstroms. A photoresist layer is formed on the gate oxide layer. An etching step is performed to pattern the gate oxide layer. The photoresist layer is removed. A gate oxide layer 106 under the photoresist layer is exposed. The gate oxide layer 106 is used for forming a thick gate oxide layer (shown in FIG. 1C in the following step. However, the photoresist layer may not be completely removed. The device quality is thus degraded.

In FIG. 1C, a thermal step is performed. The gate oxide layer 106 is oxidized again to form a thick gate oxide layer 106a. The thickness of the gate oxide layer 106a is about 125 angstroms. The exposed substrate 100 is also oxidized to form a thin gate oxide layer 116 with a thickness of about 65 angstroms. Because the material of the bottom electrode 104 is doped polysilicon, an oxide layer 126 is formed on the bottom electrode during oxidation. The oxide layer 126 serves as a dielectric layer of a capacitor. However, as it is seen in the above description, the thick gate oxide layer 106a is formed after the double oxidation steps. Therefore, it is difficult to control the thickness of the thick gate oxide layer 106a, and thus device quality is degraded.

A conductive layer 114 is formed over the substrate 100 to cover the thick gate oxide layer 106a, the thin gate oxide layer 116, and the bottom electrode 104.

In FIG. 1D, a conventional photolithographic process is performed to pattern the conductive layer 114. A gate electrode 114a is formed on the thick gate oxide layer 106a and a g,ate electrode 114c is formed on the thin gate oxide layer 116, such that different electrodes with different operation voltages are formed. A top electrode 114b is also formed on the oxide layer 126. Because the conductive layer 114 beside the bottom electrode 104 is thicker than it is on the other regions, it is difficult to completely remove the undesired conductive layer 114 near the bottom electrode 104. The remaining portions of the undesired conductive layer causes current leakage and bridging between the top electrode 114 and the bottom electrode 104.

SUMMARY OF THE INVENTION

The invention provides a method of fabricating a mixed-mode device. A first gate oxide layer is formed on a substrate. A first conductive layer is formed to cover a portion of the first gate oxide layer and a portion of the isolation structure, which is used for forming a capacitor. The first grate oxide layer is patterned with the first conductive layer serving as a mask until the substrate is exposed. A portion of the substrate is exposed. A second gate oxide layer is formed on the exposed substrate. An oxide layer is formed on the first conductive layer. A second conductive layer is formed to cover the second oxide layer and the oxide layer. The second conductive layer is patterned to form a top electrode of the capacitor. The remaining second conductive layer covers a part of the second gate oxide layer and a part of the oxide layer. The oxide layer is patterned to form a dielectric layer of the capacitor. The first conductive layer and the remaining second conductive layer are patterned to form a bottom electrode of the capacitor and a first gate and a second gate. The capacitor comprises the top electrode, the oxide layer, and the bottom electrode.

Thus, in the invention, a mixed mode device is fabricated without causing a leakage current and a bridging effect.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
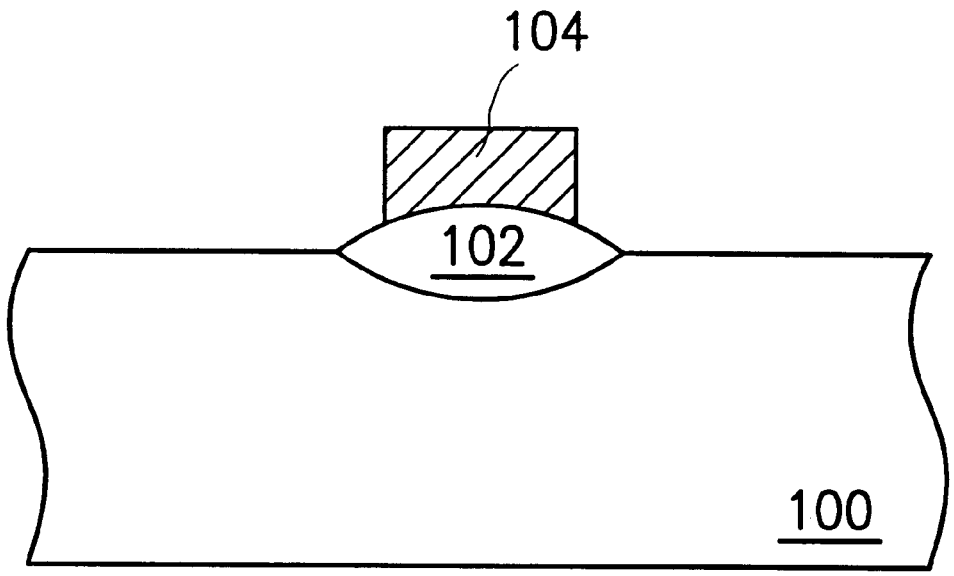
FIG. 1A through 1D are schematic, cross-sectional views showing a fabricating process for a conventional mixed-mode device.
Figure 1B:
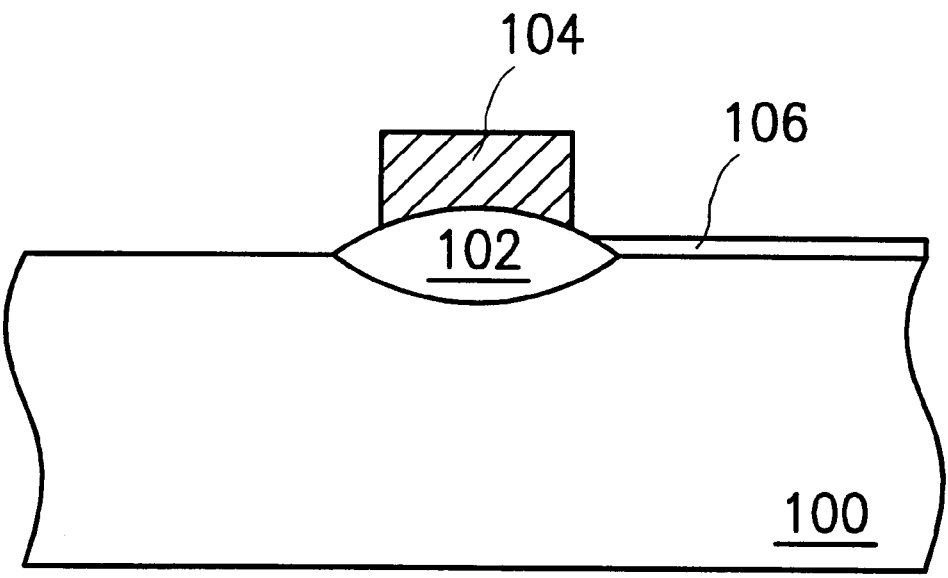
Figure 1C:
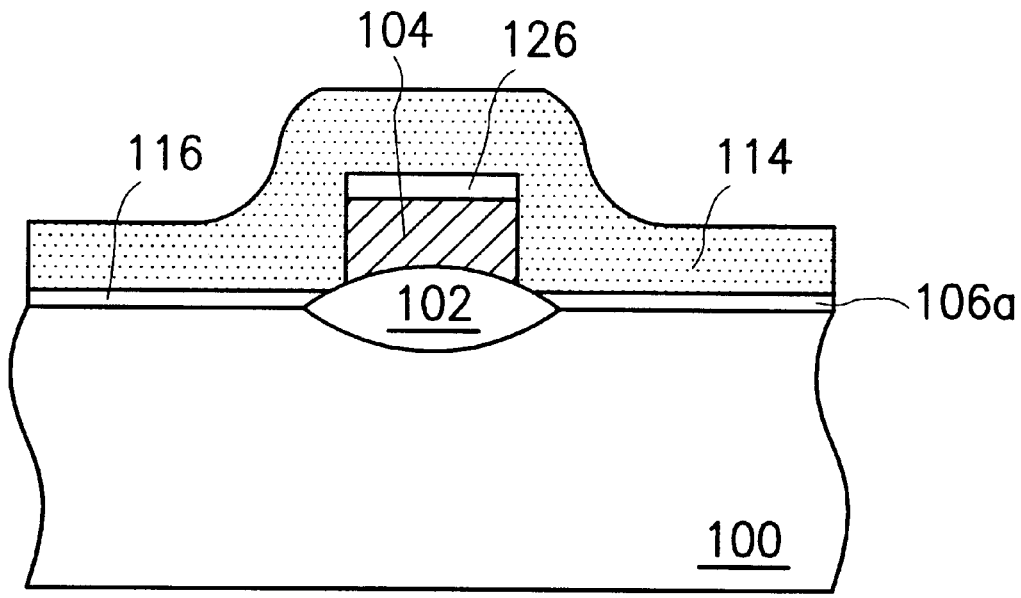
Figure 1D:
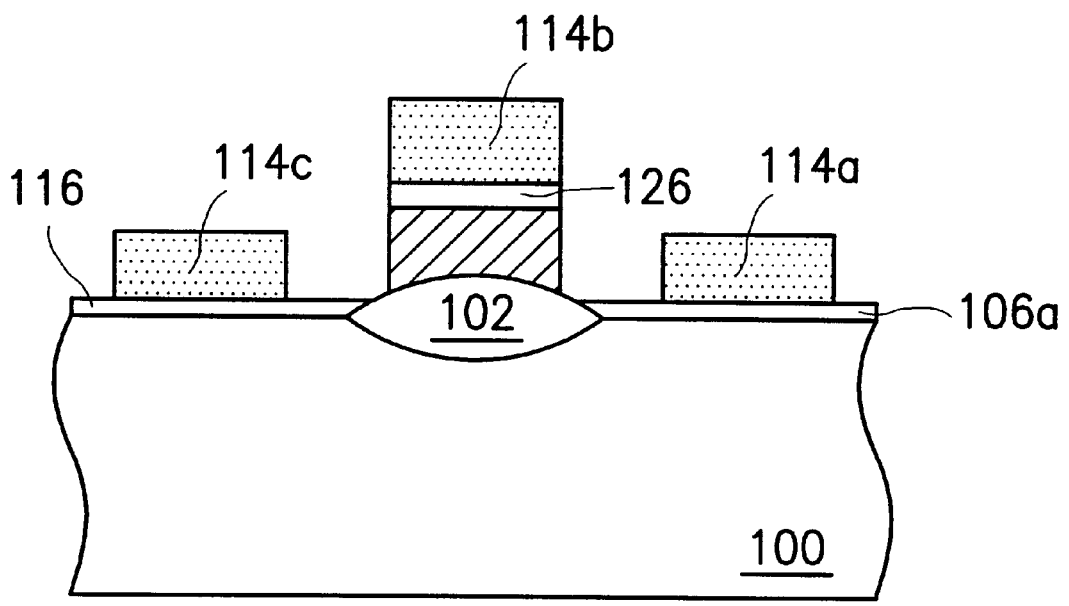

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing a fabricating process of a mixed-mode device according to one preferred embodiment of the invention.

Figure 2A:
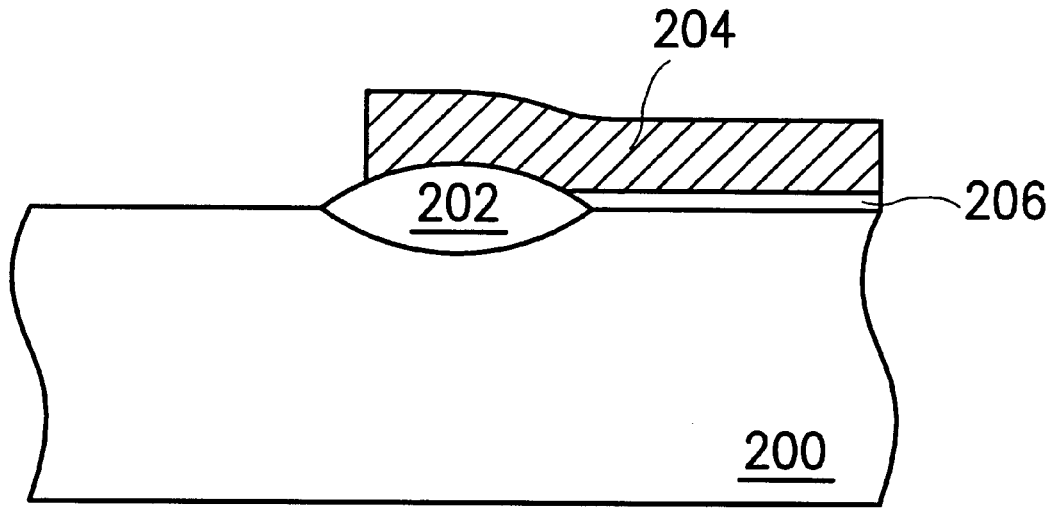
FIGS. 2A through 2D are schematic, cross-sectional views showing a fabricating process for a mixed-mode device according to one preferred embodiment of the invention.

In FIG. 2A, an isolation structure 202 is formed in a substrate 200. The isolation structure 202 can be, for example a field oxide layer or a shallow trench isolation. The preferred embodiment takes a field oxide layer as the isolation structure 202 as an example, but any other isolation structures may be used. A gate oxide layer (not shown) is formed on the substrate 200 with a first thickness. The gate oxide layer can be formed by, for example, thermal oxidation. The preferred first thickness of the gate oxide layer is about 125 angstroms. If desired, the gate oxide layer may be formed with a different thickness according to the circuit design. A conductive layer 204, such as a doped polysilicon layer, is formed on a portion of the gate oxide layer. The doped polysilicon layer 204 also extends onto a portion of the isolation structure 202, which is used for forming a bottom electrode (shown in FIG. 2D) of a capacitor (shown in FIG. 2D) thereon in the subsequence process. An etching process is performed with the doped polysilicon layer 204 serving as a mask. The gate oxide layer is patterned until the substrate 200 is exposed. A gate oxide layer 206 with a first thickness on a portion of the substrate 200 and the isolation structure 202, and covered by the first conductive layer 204, is formed.

It is known that the conventional method forms a photoresist layer on a gate oxide layer and then the photoresist layer is used as a mask during patterning. However, in the conventional method, the photoresist layer may not be easy to remove completely. The remaining photoresist layer reduces device quality. In comparison with the conventional method, the gate oxide layer is patterned with the doped polysilicon layer 204 serving as a mask in the invention. The doped polysilicon layer 204 is used as a mask instead of using photoresist layer, so that problems caused by remaining photoresist layer can be avoided.

Figure 2B:
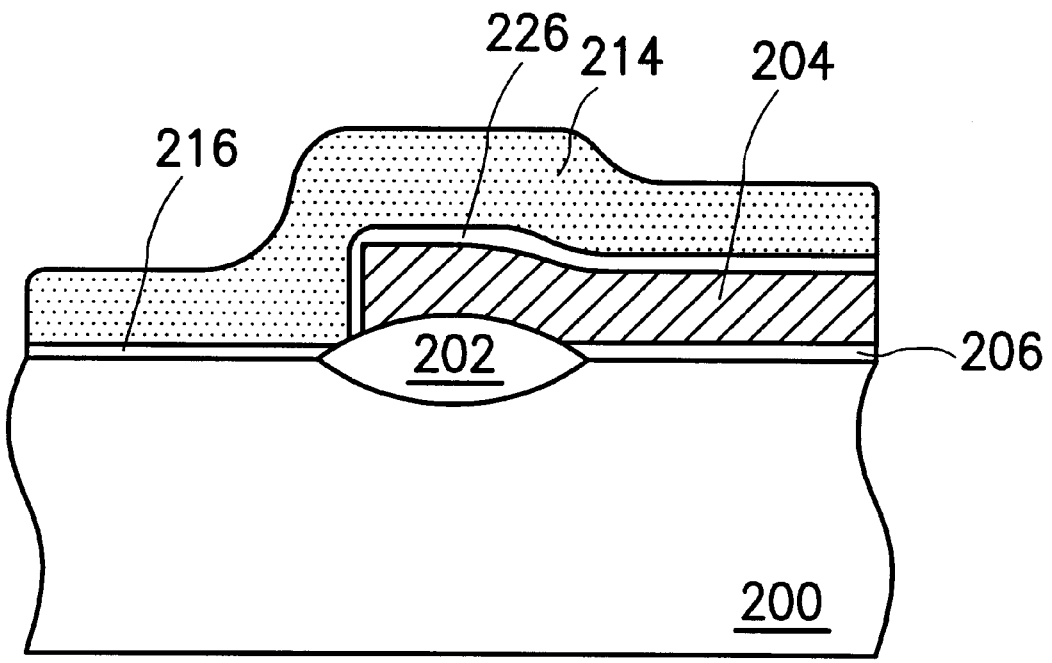

In FIG. 2B, a gate oxide layer 216 is formed with a second thickness on the exposed substrate 200. Meanwhile, an oxide layer 226 is formed on the doped polysilicon layer 204. The gate oxide layer 216 and the oxide layer 226 are formed in an identical step, such as a thermal oxidation step. The gate oxide layer 216 preferably has a second thickness of about 65 angstroms, although any other thickness may be resulted according to circuit design. A conductive layer, such as a doped polysilicon layer 214, is formed on the oxide layer 226 and the gate oxide layer 216.

In the invention, both of the gate oxide layer 206 with a first thickness and the gate oxide layer 216 with a second thickness are formed by single oxidation. Thus, it is easy to control the thickness of the gate oxide layers 206 and 216.

Figure 2C:
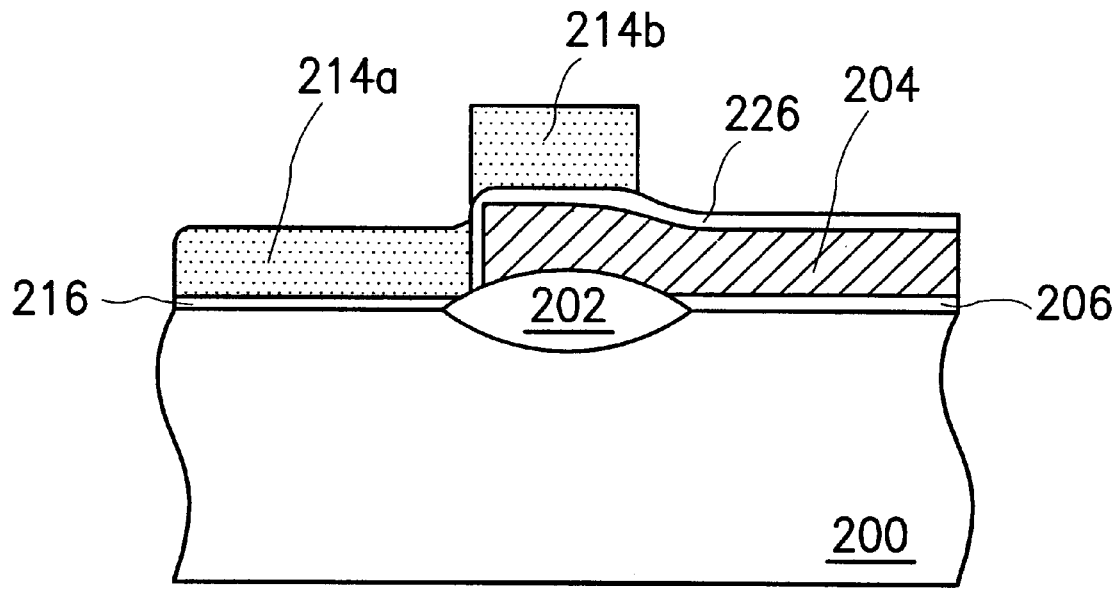

In FIG. 2C, the doped polysilicon layer 214 is patterned to leave a doped polysilicon layer 214a and a top electrode 214b. The doped polysilicon layer 214a is formed on the gate oxide layer 216 with a second thickness after patterning. The top electrode 214b is formed on the oxide layer 226.

Figure 2D:
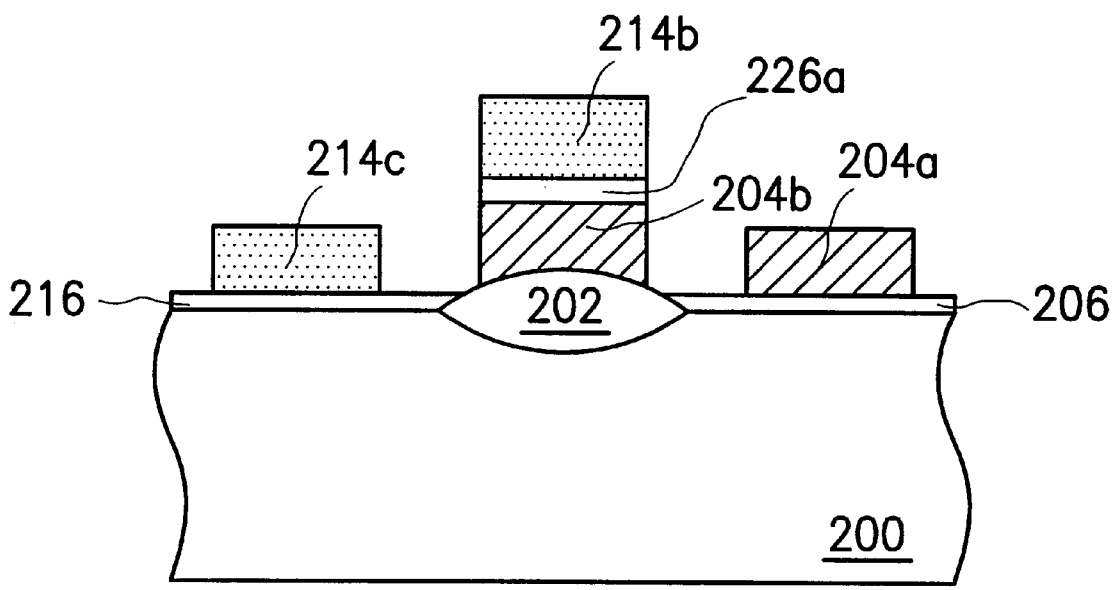

In FIG. 2D, the oxide layer 226 is patterned wit the top electrode 214 serving as a mask. An oxide layer 226a is formed between the top electrode 214b and the polysilicon layer 204b. A conventional photolithographic and etching process is performed. A mask layer (not shown), such as a photoresist layer, is formed over the substrate 200 to cover specific regions, which are used for forming gates and a capacitor in the subsequent steps. The conductive layer 204 and the conductive layer 214a are patterned. A gate 204a, which remains from the conductive layer 204, is formed on the gate oxide layer 206 with a first thickness. A bottom electrode 204b is formed on the isolation Structure 202. A gate 214c, which remains from the conductive layer 214a, is formed on the gate oxide layer 216 with a second thickness. The top electrode 214b, the oxide layer 226a, and the bottom electrode together form a capacitor. The oxide layer 226a serves as a dielectric layer of the capacitor. Then, some follow-up steps are performed on the gates 204a and 214c to complete fabrication of the transistors. It is appreciated that the follow-up steps are well known to those skilled in the art, so these follow-up steps are not here described in detail. In this manner, different transistors with different operating voltages are completed.

The conductive layer 206 and the conductive layer 214 are formed in different deposition steps. It desired, the conductive layer 206 and the conductive layer 214 can heave their individual deposited thickness. The thicknesses of the gate 204a and the gate 214a can be varied according to device design. Thus, the product variations are increased.

In addition the top electrode 214b is first patterned, and then the bottom electrode 204b is patterned. The undesired conductive layer, such as the doped polysilicon layer 214b in this preferred embodiment, can be completely removed. Hence, current leakage caused by remaining conductive layer is avoided. The bridge between the top electrode 214b and the bottom electrode 204b is avoided.

In summary, the invention has at least the following advantages:

1. In the invention, the gate oxide layer 206 with a first thickness and the gate oxide layer 216 with a second thickness are formed by single oxidation step. Thus, the thicknesses of the gate oxide layers 206 and 208 are effectively controlled.

2. The gate oxide layer is patterned with the doped polysilicon layer 204 serving as a mask. The doped polysilicon layer 204 serves as a mask instead of using a photoresist layer, such that problems caused by remaining photoresist layer can be avoided.

3. The conductive layer 206 and the conductive layer 214 are formed in different deposition steps. If desired the conductive layer 206 and the conductive layer 214 can have its individual deposited thickness. The thickness of the gate 204a and the gate 214a can be varied according to device design. Thus, the variations in products are increased.

4. In addition, the top electrode is first patterned, and then the bottom electrode is patterned. The undesired conductive layer, such as the undesired doped polysilicon layer 214, thus can be completely removed. Hence, current leakage and a bridge effect do not happen.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a mixed-mode device in a substrate having an isolation structure formed therein comprising the steps of:

forming a first gate oxide layer on the substrate;

forming a first conductive layer to cover a portion of the first gate oxide layer and a portion of the isolation structure;

patterning the first gate oxide layer with the first conductive layer serving as a mask until a portion of the substrate is exposed;

simultaneously forming a second gate oxide layer on an exposed portion of the substrate and forming an oxide layer abutting the first conductive layer without oxidizing the first gate oxide layer;

forming a second conductive layer to cover the second oxide layer and the oxide layer;

patterning the second conductive layer, wherein a remaining second conductive layer covers the second gate oxide layer and a part of the oxide layer;

patterning the oxide layer using the remaining second conductive layer as a mask; and patterning the first conductive layer and the remaining second conductive layer covering the first gate oxide layer until the first gate oxide layer is exposed.

2. The method of claim 1, wherein a material of the first conductive layer comprises doped polysilicon.

3. The method of claim 1, wherein a material of the second conductive layer comprises doped polysilicon.

4. The method of claim 1, wherein the step of forming the first gate oxide layer comprises oxidation.

5. The method of claim 1, wherein the step of forming the second gate oxide layer and the oxide layer comprises oxidation.

6. A method of fabricating a mixed-mode device, which is suitable for a substrate having an isolation structure formed therein, comprising the steps of:

forming a first gate oxide layer on a substrate;

forming a first conductive layer to cover a portion of the first gate oxide layer and a portion of the isolation structure;

patterning the first gate oxide layer with the first conductive layer serving as a mask until a portion of the substrate is exposed;

simultaneously forming a second gate oxide layer on an exposed portion of the substrate and forming an oxide layer abutting the first conductive layer without oxidizing the first gate oxide layer;

forming a second conductive layer on the second gate oxide layer; and patterning the first conductive layer and the second conductive layer to form a first gate and a second gate.

7. The method of claim 6, wherein a material of the second conductive layer comprises doped polysilicon.

8. The method of claim 6, wherein the step of forming the first gate oxide layer comprises oxidation.

9. The method of claim 6, wherein the step of forming the second gate oxide layer comprises oxidation.

10. A method of fabricating a mixed-mode device in a substrate having an isolation structure formed therein comprising the steps of:

forming a first gate oxide layer on the substrate;

forming a bottom electrode layer of a capacitor to cover a portion of the first gate oxide layer and a portion of the isolation structure;

patterning the first gate oxide layer with the bottom electrode layer serving as a mask until a portion of the substrate is exposed;

simultaneously forming a second gate oxide layer on an exposed portion of the substrate and an oxide layer abutting the bottom electrode layer without oxidizing the first gate oxide layer;

forming a conductive layer to cover the second gate oxide layer and the oxide layer;

patterning the conductive layer, wherein a remaining conductive layer covers the second gate oxide layer and a part of the oxide layer;

patterning the oxide layer using the remaining conductive layer as a mask, wherein the oxide layer serves as a dielectric layer of the capacitor; and patterning the bottom electrode layer and the remaining conductive layer covering the first gate oxide layer until the first gate oxide layer is exposed, wherein the patterned conductive layer on the oxide layer serves as a top electrode layer of the capacitor and the patterned conductive layer on the first gate oxide layer serves as a gate electrode after the patterning step of the bottom electrode layer and the remaining conductive layer is performed.

* * * * *